United States Patent [19]
Mandelcorn

[11] Patent Number: 5,739,711
[45] Date of Patent: Apr. 14, 1998

[54] REGULATION CIRCUIT FOR BIPOLAR VOLTAGE SWITCHING CIRCUITS HAVING LOGIC CIRCUITRY USING A SINGLE ERROR AMPLIFIER FOR REGULATION OF BOTH POSITIVE AND NEGATIVE VOLTAGES

[75] Inventor: Yehoshua Mandelcorn, Dallas, Tex.

[73] Assignee: Lucent Technologies Inc., Murray Hill, N.J.

[21] Appl. No.: 566,325

[22] Filed: Dec. 1, 1995

[51] Int. Cl.$^6$ .................................... H03K 3/017
[52] U.S. Cl. .................... 327/175; 327/132; 327/172; 332/110; 332/111
[58] Field of Search ................... 327/130, 131, 327/132, 172, 175; 332/109, 110, 111

[56] References Cited

U.S. PATENT DOCUMENTS

| | | |
|---|---|---|
| 4,379,240 | 4/1983 | Mammano ............................ 327/172 |
| 4,404,481 | 9/1983 | Ide et al. ............................ 327/172 |
| 5,113,158 | 5/1992 | Tsuji et al. . |
| 5,119,045 | 6/1992 | Sato . |
| 5,140,591 | 8/1992 | Palara et al. ............................ 327/130 |
| 5,208,559 | 5/1993 | Jordan . |
| 5,295,158 | 3/1994 | Jordan . |
| 5,361,048 | 11/1994 | Baum et al. ............................ 332/109 |
| 5,379,321 | 1/1995 | Girmay ............................ 327/172 |
| 5,589,805 | 12/1996 | Zuraski et al. ............................ 332/109 |

*Primary Examiner*—Terry Cunningham
*Attorney, Agent, or Firm*—A. G. Steinmetz

[57] ABSTRACT

A circuit suitable for use in a regulated bi-directional output power supply requiring controlled transitions between states, such as in a Battery Polarity Switch is provided to utilize many of the same circuit components in regulating both opposing polarities of the output signal. An exemplary circuit achieves use of a single error amplifier and pulse width modulator circuit to obtain both positive and negative regulation of the battery polarity switch output, along with controlled transition between the two states. In a specific embodiment a logic inverter allows the single pulse width modulator to control in both directions. A ramped reference fed to the error amplifier allows the same amplifier to control the transitions.

15 Claims, 2 Drawing Sheets

5,739,711

REGULATION CIRCUIT FOR BIPOLAR VOLTAGE SWITCHING CIRCUITS HAVING LOGIC CIRCUITRY USING A SINGLE ERROR AMPLIFIER FOR REGULATION OF BOTH POSITIVE AND NEGATIVE VOLTAGES

FIELD OF THE INVENTION

This invention relates to regulation circuitry for application to bi-directional output power supplies requiring controlled transitions between voltage polarity states. It is particularly concerned with the use of a single error amplifier in regulating both voltage polarities. In a specific instance it is applied to a bipolar voltage polarity switch.

BACKGROUND OF THE INVENTION

A bi-polarity switch is generally operative to periodically reverse the polarity of an input DC voltage, particularly a DC voltage provided by a battery source. In doing so it produces a low frequency trapezoidal waveform with a controlled amplitude. Controlling the amplitude of this waveform requires regulation of opposing polarities of the signal. With conventional regulation circuitry, separate circuitry is required for each signal polarity. In particular the regulatory circuitry may require 2 to 4 separate controller error amplifiers and 2 separate pulse width modulators. This may be prohibitively expensive and inefficient for particular applications.

SUMMARY OF THE INVENTION

A circuit suitable for use in a regulated bi-directional output power supply requiring controlled transitions between states, such as in a Battery Polarity Switch is provided to utilize many of the same circuit components in regulating both opposing polarities of the output signal.

An exemplary circuit achieves use of a single error amplifier and pulse width modulator circuit to obtain both positive and negative regulation of the battery polarity switch output, along with controlled transition between the two states.

In a specific embodiment a logic inverter allows the single pulse width modulator to control in both directions. A ramped reference fed to the error amplifier allows the same amplifier to control the transitions.

BACKGROUND OF THE INVENTION

FIG. 1 is a schematic of a power train of an exemplary battery polarity switch; and FIG. 2 is a schematic of a pulse width control regulation circuit for regulating a pulse signal amplitude of the exemplary battery polarity switch of FIG. 1.

DETAILED DESCRIPTION

Figure 1:
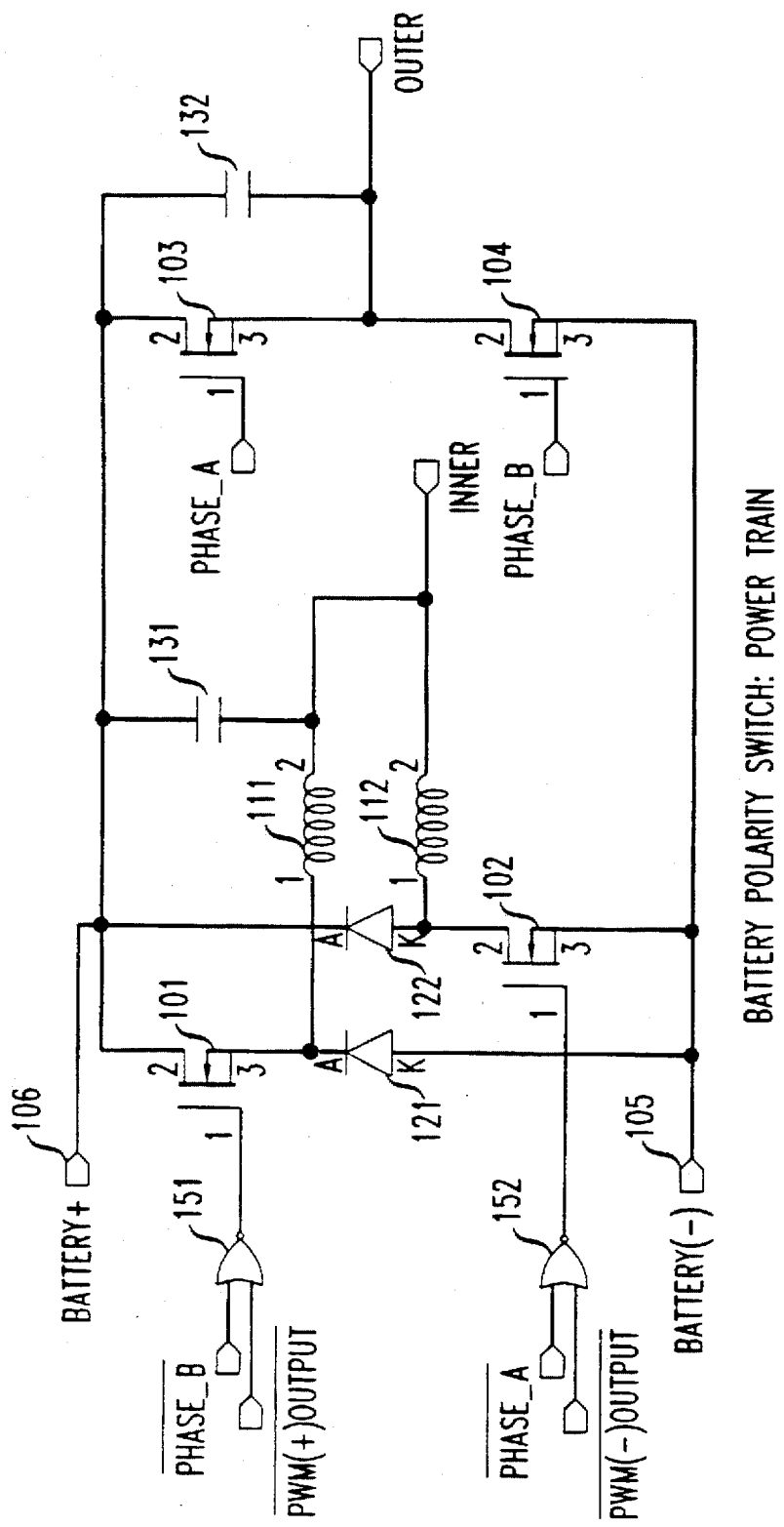

In the exemplary battery polarity switch of FIG. 1, to be regulated, alternating polarity voltage levels (i.e., in the form of a low frequency alternating trapezoidal waveform at from 1 to 60 Hz with controlled transition between positive and negative states) are applied to a coaxial cable connected to a load which may be energized by a low frequency AC voltage. The BPS cycle is split into 2 alternate phases A and B, each continuing for nearly 50% of the cycle time. During Phase A the output is first slewed from positive to negative and then held negative for the duration of the phase. During Phase B the output is first slewed from negative to positive and then held positive for the duration of the phase. Output is going to a coaxial cable with the controlled output defined as "coax inner" minus "coax outer" in consideration of the shield and core of the coaxial cable load.

The power train consists of 4 switches 101,102, 103 and 104 (e.g., MOSFET's) connected in a modified H-Bridge with its input taken off the Battery DC voltage with opposite legs being turned on and off every BPS cycle to deliver an alternating trapezoidal wave to the output coaxial cable. Switches 103 and 104 shall alternately connect the outer coax to Battery positive 106 and Battery negative 105 respectively. Switches 101 and 102 serve as parts of the 2 buck regulators, including inductors 111 and 112, controlling the voltage to the inner Coax.

During phase A the outer coax is connected to the positive terminal 106 (+) of the battery through 103. Switch 102 with the clamp diode 122 and inductor choke 112 comprise a buck regulator and is operative to provide a regulated negative voltage at the inner coax with respect to the outer coax. The switch 102 is turned on and off (i.e., pulse width modulated) at a high frequency suitable to achieve buck regulation. Inductor choke 112 in combination with the output capacitor 131 filters the high frequency pulses to provide the desired low frequency regulated trapezoid waveform. The duty cycle is appropriately controlled to allow for a smooth transition of the inner coax form a positive to negative output. A clamp diode conducts 122 when the switch 102 is off.

During the alternate phase B the outer coax is connected to the battery (−) negative terminal 105 through the switch 104. Switch 101 in combination with clamp diode 121 and inductor 111 operates as a buck regulator which provides a regulated positive to the inner coax with respect to the output coax. Switch 101 is switched a relatively high frequency suitable to the regulation function of the buck regulator. Its duty cycle is controlled to achieve a controlled transition time during phase transitions (i.e., slewing of the inner from a negative to positive output) and regulate the trapezoid output during the balance of the phase interval.

In the circuit of FIG. 1 the power switch 102 is turned on when the inverted phase A is low and the inverted PWM signal output is low. Clamp diode 122 conducts when switch 102 is off and output choke 112 in combination with the output capacitor 131 average the pulse signal to provide the low frequency output voltage with a trapezoid waveform.

Power switches 103 and 104 are connected to the output coax cable and are switched on/off at a much lower frequency (e.g., once every BPS cycle as contrasted with the buck regulator frequency used with transitioning 101 and 102) to establish the frequency of the output voltage waveform.

Figure 2:
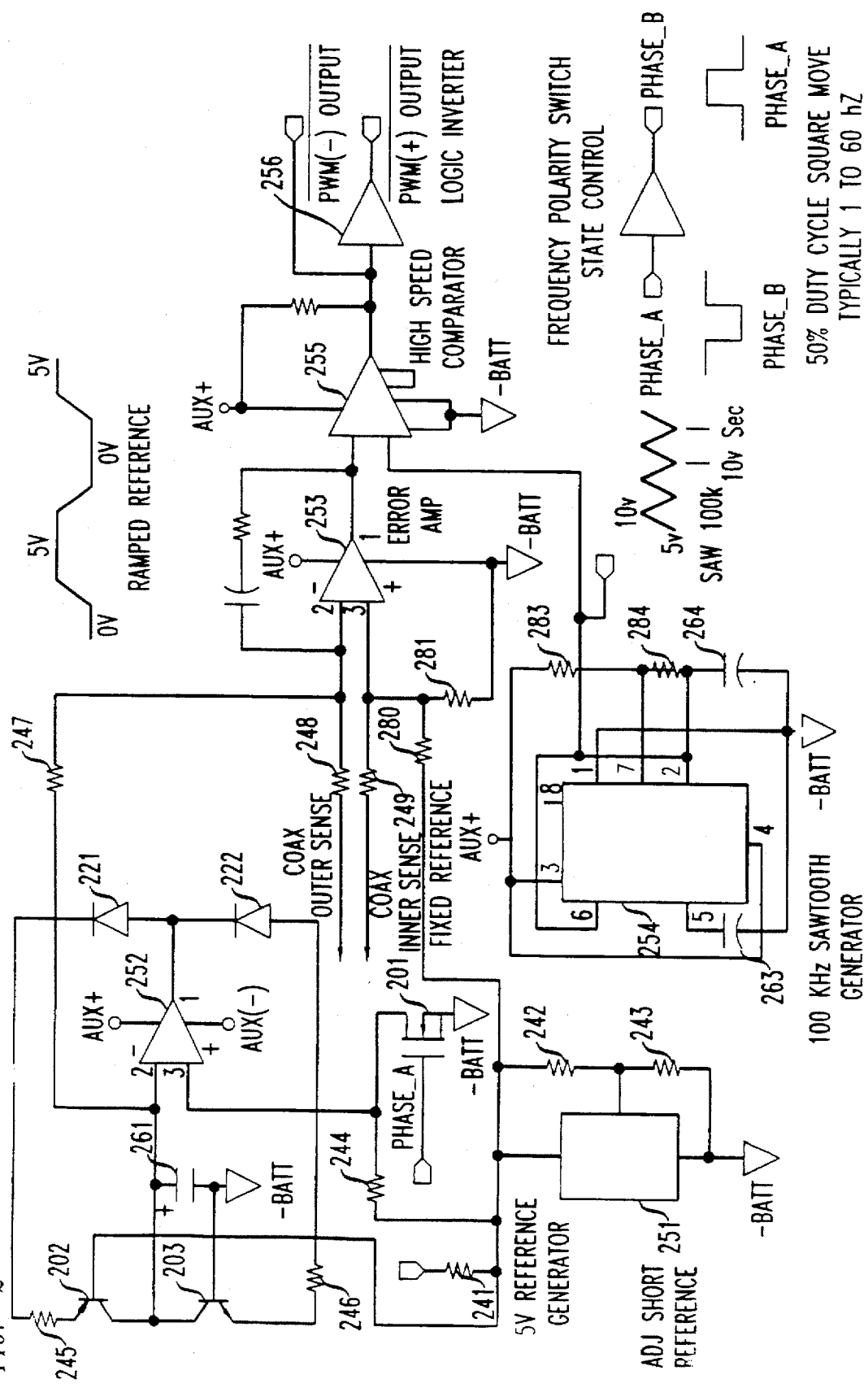

The amplitude of the trapezoidal voltage waveform is controlled by voltage regulator circuitry as shown in FIG. 2. This regulator circuitry controls the output of the polarity switch (BPS) (inner minus outer) such that when PHASE_A is high the output is negative and when PHASE_B is high the output is positive. All the ramped transitions between the alternate phases are controlled to take a controlled time duration. The voltage regulator circuit generates the drive pulses for the power switch 101 when PHASE_B is high and for 102 when PHASE_A is high. In the illustrative embodiment operating at a 1 Hz output the duration of each phase is 500 milli-seconds.

Six major components may be defined within the voltage regulator circuit. First is the precision five voltage reference including a voltage reference chip 251 in circuit with the resistors 241,242 and 243. A ramped voltage generator comprises the operational amplifier chip 252 and the associated transistors 201,202 and 203. A voltage error amplifier 253 is combined with resistors 248 and 249. 254 is a sawtooth voltage waveform generator (i.e., 100 KHZ). Comparator 255 is a pulse width modulator comparator and amplifier 256 is a phase inverter.

DC reference circuit 251 provides a fixed reference voltage which in the illustrative embodiment is 5 volts. The reference voltage is provided to the base of transistor 202 which forms part of the ramp voltage generator and provides a ramp voltage waveform across the capacitor 261. This ramped voltage is used by the voltage error amplifier 253 as described below to switch the regulation point of the output between positive and negative states with a controlled transition time. This ramped voltage is a key element in the attainment of the alternating positive and negative set points, along with the desired transition times between the positive and negative states with a single error amplifier 253.

When PHASE_A goes low 201 is turned off, and accordingly its drain voltage supplying positive input to op amp 252 rises to five volts through resistor 244. With the (+) input at +5 volts and its (−) input at zero, the output of the op amp 252 rises to the value AUX+ which is approximately 15 volts. Capacitor 261 is charged via diode 221 and a current source formed by transistor 202 and resistor 245, thereby providing a linear ramped voltage. Transition time is controlled by the component values of capacitor 261 and resistor 245. Upon the attainment of 5 volts the two inputs to the op amp 252 become equal and the output of the op amp drops to the 5 volt level of capacitor 261.

When PHASE_A goes high, transistor 201 is turned on causing the input to op amp 252 to drop to zero volts through transistor 201. With the (+) input of 252 at 0 volts and the (−) input at +5 volts, the op amp 252 output drops to the negative AUX(−) (e.g., approx −13 volts). Capacitor 261 is discharged to zero volts through a current sink formed by diode 222, resistor 246 and transistor 203. The component values of capacitor 261 and resistor 246 determine the transition time. When the two inputs to op amp 252 become equal, its output maintains the capacitor 261 at zero volts.

The ramped reference voltage on capacitor 261 is applied to error amplifier 253, via resistor 247, at a node connected in turn to the coax outer sense, via resistor 248. Its other input is connected to coax inner sense, via resistor 249, and to a reference voltage at the junction of resistors 280 and 281. The connections and resistors 247, 248, 249, 280 and 281 are selected to assure that the reference voltage regulates the output of the error amplifier 253 to a negative control value when the ramp voltage is zero and to a positive control value when the ramp voltage is +5 volts. When PHASE_A is high and the ramp voltage is zero, the regulation point causing the two inputs to error amplifier 253 to be equal is achieved when the INNER minus OUTER voltage equals the regulated negative output. If the negative output attempts to increase, the error amplifier 253 output drops in voltage causing the duty cycle of pulse width modulator 255 to decrease to compensate for the voltage change.

When PHASE_B is high and the ramp voltage is +5 volts, the regulation point causing the two inputs to error amplifier 253 to be equal is achieved when the INNER minus OUTER voltage equals the regulated positive voltage. If the positive voltage increases, the error amplifier 253 output increases and the duty cycle of pulse width modulator 255 must decrease to compensate for this change.

The pulse width modulator 255 is essentially a comparator amplifier whose inputs accept the a sawtooth wave form and the output of error amplifier 253. The resultant output of amplifier 253 is a pulse width modulated signal with varying duty cycles.

A timing waveform is generated by the sawtooth generator 254. Generator 254 is a 555 timer which supplies a sawtooth waveform to capacitor 264. Capacitor 264 is charged through resistors 283 and 284. Capacitor 263 stabilizes the internal timer control voltage of the timer. While a '555' timer is illustratively described, it is to be understood that other timers may be used for this function.

During the interval when PHASE_A is high, power transistor 102 is conducting and the negative output voltage is being regulated in response to the duty cycle control. When PHASE_B is high power transistor 101 is conducting and the positive output is being inverted by the inverter 256 to achieve regulation of the positive output voltage. Use of the inverter 256 eliminates the need for a separate pulse width modulator to control power transistor 101 for positive output.

Because the power switches are driven by outputs of NOR gates 151 and 152 in FIG. 1, a LOW voltage output of the pulse width modulator turns on the the power switch whose phase is enabled. In FIG. 2, error amplifier's 253 output is connected to inverting input of comparator 255. Hence, as the output of error amplifier 253 increases, the duty cycle, at which the comparator 255 is low, increases. For PHASE_A the pulse width modulator output is applied to negative regulating switch 102 in FIG. 1; by feeding comparator's 255 output (FIG. 2) directly to the NOR gate 152 (in FIG. 1 going to switch 102) negative feedback is achieved.

However, for PHASE_B and positive regulating of switch 101 (FIG. 1); tying the comparator 255 output (FIG. 2) directly to the NOR gate 151 in FIG. 1 would achieve positive feedback and instability. Hence for PHASE_B operation, logic inverter 256 (FIG. 2), inverts the comparator 255 output before its being applied to the PHASE_B NOR gate 151 in FIG. 1. This achieves negative feedback and operational stability.

The invention claimed is:

1. A regulation circuit for regulating oppositely phased first and second power switches to provide opposite polarity regulated voltages at a first and a second output node comprising:

an error amplifier having first and second inputs for accepting a potential sensed at the first output node and the second output node, respectively, the first and second inputs further accepting a substantially fixed reference voltage and a ramp voltage waveform, respectively;

a comparator circuit for comparing an output of the error amplifier with a sawtooth voltage waveform and driving the first power switch in response thereto, the output of the comparator circuit being inverted to drive the second power switch.

2. The regulation circuit as recited in claim 1 wherein the first and second power switches are elements of a first and second buck regulator circuit, respectively.

3. The regulation circuit as recited in claim 1 wherein the comparator circuit comprising a logic inverter that inverts the output of the comparator circuit to drive the second power switch.

4. The regulation circuit as recited in claim 1 wherein the error amplifier includes a feedback network.

5. The regulation circuit as recited in claim 1 further comprising a DC reference circuit for generating the substantially fixed reference voltage.

6. The regulation circuit as recited in claim 1 further comprising a transistor and capacitor for generating the ramp voltage waveform.

7. The regulation circuit as recited in claim 1 further comprising a dual threshold relaxation oscillator for generating the sawtooth voltage waveform.

8. A method for regulating oppositely phased first and second power switches to provide opposite polarity regulated voltages at a first and a second output node, comprising:

sensing a potential at the first output node and a second output node at first and second inputs, respectively, with an error amplifier, the first and second inputs further accepting a ramp voltage waveform and substantially fixed reference voltage, respectively;

comparing the output of the error amplifier with a sawtooth voltage waveform and driving the first power switch in response thereto; and inverting the output of the comparator circuit and driving the second power switch in response thereto.

9. The method as recited in claim 8 wherein the first and second power switches are elements of a first and second buck regulator circuit, respectively.

10. The method as recited in claim 8 wherein the potential is a voltage.

11. The method as recited in claim 8 wherein the error amplifier includes a feedback loop.

12. A regulation circuit for a voltage polarity switching circuit that generates alternate phases of a regulated voltage at a low frequency, the voltage polarity switching circuit having first and second power switches connected to operate in opposite phases and to apply a regulated voltage output to an output node, the regulation circuit, comprising:

a ramp generator for generating a ramp voltage waveform, said ramp generator having a source for generating a constant current and;

a capacitor charged by the constant current a DC reference circuit for generating a substantially fixed reference voltage;

an error amplifier having first and second inputs, the first input receiving a voltage sensed at the output node and the substantially fixed reference voltage, the second input receiving a voltage sensed at another output node and the ramp voltage waveform;

a sawtooth voltage waveform generator for generating a sawtooth voltage waveform;

a comparator circuit having first and second inputs, the first input receiving an output of the error amplifier and the second input capable of receiving the sawtooth voltage waveform, an output of the comparator circuit applied to the first power switch; and a polarity inverter connected for inverting the output of the comparator circuit and applying an inverted output to the second power switch.

13. The regulation circuit as recited in claim 12 wherein the source comprises a transistor and a resistor.

14. The regulation circuit as recited in claim 12 wherein the error amplifier includes a feedback network.

15. The regulation circuit as recited in claim 12 wherein the sawtooth voltage waveform generator includes a dual threshold relaxation oscillator.

* * * * *